(12) United States Patent
Seidel et al.

(10) Patent No.: US 8,344,474 B2
(45) Date of Patent: Jan. 1, 2013

(54) MICROSTRUCTURE DEVICE INCLUDING A METALLIZATION STRUCTURE WITH SELF-ALIGNED AIR GAPS AND REFILLED AIR GAP EXCLUSION ZONES

(75) Inventors: Robert Seidel, Dresden (DE); Thomas Werner, Moritzburg (DE)

(73) Assignee: Advanced Micro Devices, Inc., Austin, TX (US)

( * ) Notice: Subject to any disclaimer, the term of this patent is extended or adjusted under 35 U.S.C. 154(b) by 338 days.

(21) Appl. No.: 12/708,230

(22) Filed: Feb. 18, 2010

(65) Prior Publication Data

US 2010/0219534 A1    Sep. 2, 2010

(30) Foreign Application Priority Data

Feb. 27, 2009   (DE) .......................... 10 2009 010 845

(51) Int. Cl.
*H01L 21/70* (2006.01)
(52) U.S. Cl. ......... 257/522; 257/E21.573; 257/E29.018; 257/E23.142; 257/E21.24; 438/422; 438/618; 438/694
(58) Field of Classification Search .................. 438/422, 438/618; 257/522, E21.573, E29.018, E23.142, 257/E21.24, E21.295
See application file for complete search history.

(56) References Cited

U.S. PATENT DOCUMENTS

| | | | | |
|---|---|---|---|---|
| 5,512,775 A * | 4/1996 | Cho | ............................... | 257/522 |
| 5,847,439 A * | 12/1998 | Reinberg | ...................... | 257/522 |
| 5,923,074 A * | 7/1999 | Jeng | ............................... | 257/522 |
| 5,949,143 A * | 9/1999 | Bang | ............................. | 257/758 |
| 6,057,226 A * | 5/2000 | Wong | ............................ | 438/623 |
| 6,331,378 B1 * | 12/2001 | Endo | ............................... | 430/314 |
| 6,368,939 B1 * | 4/2002 | Sasaki | ........................... | 438/421 |
| 6,399,476 B2 * | 6/2002 | Kim et al. | ...................... | 438/619 |
| 6,440,839 B1 * | 8/2002 | Partovi et al. | .................. | 438/619 |
| 6,509,623 B2 * | 1/2003 | Zhao | ............................... | 257/522 |
| 6,524,948 B2 * | 2/2003 | Tamaoka et al. | .............. | 438/637 |
| 6,984,577 B1 * | 1/2006 | Zhao et al. | ..................... | 438/619 |
| 6,998,216 B2 * | 2/2006 | He et al. | ........................ | 430/296 |
| 7,023,063 B2 * | 4/2006 | Gabric et al. | .................. | 257/396 |
| 7,172,980 B2 * | 2/2007 | Torres et al. | ................... | 438/783 |
| 7,309,649 B2 * | 12/2007 | Colburn et al. | ............... | 438/639 |
| 7,332,406 B2 * | 2/2008 | Park et al. | ..................... | 438/422 |
| 7,361,991 B2 * | 4/2008 | Saenger et al. | ............... | 257/750 |
| 7,531,444 B2 * | 5/2009 | Dimitrakopoulos et al. | . | 438/619 |
| 7,566,656 B2 * | 7/2009 | Liu et al. | ........................ | 438/667 |
| 7,755,160 B2 * | 7/2010 | Gabric et al. | ................. | 257/508 |
| 7,888,746 B2 * | 2/2011 | Tischler | ......................... | 257/379 |
| 2002/0028575 A1 * | 3/2002 | Besling et al. | ................ | 438/638 |

(Continued)

OTHER PUBLICATIONS

Translation of Official Communication from German Patent Office for German Patent Application No. 10 2009 010 845.9-33 dated Feb. 16, 2010.

*Primary Examiner* — N Drew Richards
*Assistant Examiner* — Ankush Singal
(74) *Attorney, Agent, or Firm* — Williams, Morgan & Amerson, P.C.

(57) ABSTRACT

In a sophisticated metallization system, self-aligned air gaps may be provided in a locally selective manner by using a radiation sensitive material for filling recesses or for forming therein the metal regions. Consequently, upon selectively exposing the radiation sensitive material, a selective removal of exposed or non-exposed portions may be accomplished, thereby resulting in a highly efficient overall manufacturing flow.

21 Claims, 6 Drawing Sheets

U.S. PATENT DOCUMENTS

| | | | |
|---|---|---|---|
| 2002/0045332 A1* | 4/2002 | Jang et al. | 438/585 |
| 2002/0048933 A1* | 4/2002 | Brankner et al. | 438/626 |
| 2003/0008513 A1* | 1/2003 | Howard | 438/694 |
| 2003/0205817 A1* | 11/2003 | Romankiw | 257/758 |
| 2004/0058277 A1* | 3/2004 | He et al. | 430/296 |
| 2004/0113153 A1* | 6/2004 | Wong et al. | 257/72 |
| 2004/0137728 A1* | 7/2004 | Gallagher et al. | 438/689 |
| 2005/0037604 A1* | 2/2005 | Babich et al. | 438/619 |
| 2005/0074961 A1* | 4/2005 | Beyer et al. | 438/619 |
| 2005/0167838 A1* | 8/2005 | Edelstein et al. | 257/758 |
| 2005/0184397 A1* | 8/2005 | Gates et al. | 257/774 |
| 2005/0272248 A1* | 12/2005 | Kloster et al. | 438/618 |
| 2006/0138663 A1* | 6/2006 | Clarke et al. | 257/758 |
| 2006/0177990 A1* | 8/2006 | Beyer et al. | 438/421 |
| 2006/0183315 A1* | 8/2006 | Dimitrakopoulos et al. | 438/619 |
| 2007/0246831 A1* | 10/2007 | Gabric et al. | 257/758 |
| 2007/0282030 A1* | 12/2007 | Anderson et al. | 522/1 |
| 2008/0014369 A1* | 1/2008 | Chang et al. | 427/535 |
| 2008/0038916 A1* | 2/2008 | Rottenberg et al. | 438/619 |
| 2008/0042283 A1* | 2/2008 | Purushothaman et al. | 257/754 |
| 2008/0182403 A1* | 7/2008 | Noori et al. | 438/618 |
| 2008/0185722 A1* | 8/2008 | Liu et al. | 257/751 |
| 2009/0093132 A1* | 4/2009 | Xu et al. | 438/780 |
| 2009/0104571 A1* | 4/2009 | Liu et al. | 430/327 |
| 2009/0130863 A1* | 5/2009 | Toma et al. | 438/795 |
| 2009/0146244 A1* | 6/2009 | Tischler | 257/506 |
| 2009/0291542 A1* | 11/2009 | Song et al. | 438/381 |
| 2009/0303359 A1* | 12/2009 | Otsuka et al. | 348/280 |
| 2011/0101492 A1* | 5/2011 | Won et al. | 257/522 |
| 2011/0260323 A1* | 10/2011 | Yang et al. | 257/751 |

* cited by examiner

MICROSTRUCTURE DEVICE INCLUDING A METALLIZATION STRUCTURE WITH SELF-ALIGNED AIR GAPS AND REFILLED AIR GAP EXCLUSION ZONES

BACKGROUND OF THE INVENTION

1. Field of the Invention

Generally, the present disclosure relates to microstructure devices, such as integrated circuits, and, more particularly, to the metallization layers including highly conductive metals, such as copper, and dielectric materials including air gaps.

2. Description of the Related Art

In modern integrated circuits, minimum feature sizes, such as the channel length of field effect transistors, have reached the deep sub-micron range, thereby steadily increasing performance of these circuits in terms of speed and/or power consumption and/or diversity of circuit functions. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines and the spaces between the metal lines have to be reduced to compensate for a reduced amount of available floor space and for an increased number of circuit elements provided per unit area.

In integrated circuits having minimum dimensions of approximately 0.35 μm and less, a limiting factor of device performance is the signal propagation delay caused by the switching speed of the transistor elements. As the channel length of these transistor elements has now reached 50 nm and less, the signal propagation delay is no longer limited by the field effect transistors, but is limited, owing to the increased circuit density, by the interconnect lines, since the line-to-line capacitance (C) is increased and also the resistance (R) of the lines is increased due to their reduced cross-sectional area. The parasitic RC time constants and the capacitive coupling between neighboring metal lines, therefore, require the introduction of a new type of material for forming the metallization layer.

Traditionally, metallization layers, i.e., the wiring layers including metal lines and vias for providing the electrical connection of the circuit elements according to a specified circuit layout, are formed by a dielectric layer stack including, for example, silicon dioxide and/or silicon nitride, with aluminum as the typical metal. Since aluminum suffers from significant electromigration at higher current densities that may be necessary in integrated circuits having extremely scaled feature sizes, aluminum is being replaced by, for instance, copper, which has a significantly lower electrical resistance and a higher resistivity against electromigration. For highly sophisticated applications, in addition to using copper and/or copper alloys, the well-established and well-known dielectric materials silicon dioxide (k≈4.2) and silicon nitride (k>7) may increasingly be replaced by so-called low-k dielectric materials having a relative permittivity of approximately 3.0 and less. However, the transition from the well-known and well-established aluminum/silicon dioxide metallization layer to a copper-based metallization layer, possibly in combination with a low-k dielectric material, is associated with a plurality of issues to be dealt with.

For example, copper may not be deposited in relatively high amounts in an efficient manner by well-established deposition methods, such as chemical and physical vapor deposition. Moreover, copper may not be efficiently patterned by well-established anisotropic etch processes. Therefore, the so-called damascene or inlaid technique is frequently employed in forming metallization layers including copper lines and vias. Typically, in the damascene technique, the dielectric layer is deposited and then patterned for receiving trenches and via openings that are subsequently filled with copper or alloys thereof by plating methods, such as electroplating or electroless plating. Moreover, since copper readily diffuses in a plurality of dielectrics, such as silicon dioxide and in many low-k dielectrics, the formation of a diffusion barrier layer at interfaces with the neighboring dielectric material may be required. Moreover, the diffusion of moisture and oxygen into the copper-based metal has to be suppressed as copper readily reacts to form oxidized portions, thereby possibly deteriorating the characteristics of the copper-based metal line with respect to adhesion, conductivity and the resistance against electromigration.

During the filling in of a conductive material, such as copper, into the trenches and via openings, a significant degree of overfill has to be provided in order to reliably fill the corresponding openings from bottom to top without voids and other deposition-related irregularities. Consequently, after the metal deposition process, excess material may have to be removed and the resulting surface topography is to be planarized, for instance, by using electrochemical etch techniques, chemical mechanical polishing (CMP) and the like. For example, during CMP processes, a significant degree of mechanical stress may be applied to the metallization levels formed so far, which may cause structural damage to a certain degree, in particular when sophisticated dielectric materials of reduced permittivity are used. As previously explained, the capacitive coupling between neighboring metal lines may have a significant influence on the overall performance of the semiconductor device, in particular in metallization levels, which are substantially "capacitance driven," i.e., in which a plurality of closely spaced metal lines have to be provided in accordance with device requirements, thereby possibly causing signal propagation delay and signal interference between neighboring metal lines. For this reason, so-called low-k dielectric materials or ultra low-k materials may be used, which may provide a dielectric constant of 3.0 and significantly less, in order to enhance the overall electrical performance of the metallization levels. On the other hand, typically, a reduced permittivity of the dielectric material is associated with a reduced mechanical stability, which may require sophisticated patterning regimes so as to not unduly deteriorate reliability of the metallization system.

The continuous reduction of the feature sizes, however, with gate lengths of approximately 40 nm and less, may demand even more reduced dielectric constants of the corresponding dielectric materials, which may increasingly contribute to yield loss due to, for instance, insufficient mechanical stability of respective ultra low-k materials. For this reason, it has been proposed to introduce "air gaps," at least at critical device areas, since air or similar gases may have a dielectric constant of approximately 1.0, thereby providing a reduced overall permittivity, while nevertheless allowing the usage of less critical dielectric materials. Hence, by introducing appropriately positioned air gaps, the overall permittivity may be reduced while, nevertheless, the mechanical stability of the dielectric material may be superior compared to conventional ultra low-k dielectrics. For example, it has been proposed to introduce nano holes into appropriate dielectric materials, which may be randomly distributed in the dielectric material so as to significantly reduce the density of the dielectric material. However, the creation and distribution of the respective nano holes may require a plurality of sophisticated process steps for creating the holes with a desired density, while at the same time the overall characteristics of the dielectric material may be changed in view of the further processing, for instance with respect to planarizing surface areas, depositing further materials and the like.

In other approaches, advanced lithography processes are additionally introduced to create appropriate etch masks for forming gaps near respective metal lines with a position and size as defined by the lithographically formed etch mask. In this case, however, additional cost-intensive lithography steps may be required, wherein the positioning and the dimensioning of the corresponding air gaps may also be restricted by the capabilities of the respective lithography processes. Since, typically, in critical metallization levels, the lateral dimensions of metal lines and the spacing between adjacent metal lines may be defined by critical lithography steps, an appropriate and reliable manufacturing sequence for providing intermediate air gaps may be difficult to be achieved on the basis of the available lithography techniques.

In other conventional approaches, the dielectric material of the metallization layer under consideration may be etched selectively with respect to the metal lines down to a specified depth, thereby avoiding complex lithography steps for positioning the air gaps between the metal lines. Consequently, a self-aligned technique may be accomplished by using the etch selectivity between the metal lines and the dielectric material. In other cases, at least a portion of the dielectric material may be formed by using an appropriate material composition, which may allow an efficient removal, for instance on the basis of well-established etch recipes, etching processes and the like. In this case, the metal lines may be formed in the sacrificial dielectric material, which may then be efficiently removed so as to obtain corresponding recesses, which may subsequently be capped by depositing a dielectric material. Consequently, the latter approaches may provide self-aligned process strategies by removing at least a portion of the dielectric material down to a specified depth on the basis of etch techniques without requiring critical lithography processes. Although these approaches are very promising and may result in a cost-efficient production sequence, the exclusion of specific device areas with respect to the formation of air gaps may be associated with additional process complexity, thereby offsetting many of the advantages of these approaches with respect to other conventional techniques discussed above.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and devices in which air gaps may be positioned between closely spaced metal regions in a self-aligned manner while, additionally, the provision of the air gaps may be restricted to preselected device areas. For this purpose, in some illustrative aspects disclosed herein, recesses may be formed by removing a dielectric material of a metallization layer selectively with respect to the metal regions and subsequently refilling the recesses by a radiation sensitive material. Thereafter, the radiation sensitive material may be appropriately exposed to a radiation beam, such as an optical beam provided by a lithography tool, a scanning laser beam, an electron beam, an ion beam and the like, thereby modifying the characteristics of the radiation sensitive material in a local manner. Consequently, the exposed portion or the non-exposed portion, depending on the characteristics of the radiation sensitive material, may be efficiently removed without requiring an additional complex masking regime to remove the material from specific recesses, which may subsequently be closed to form the air gaps in a locally selective manner. In other illustrative aspects disclosed herein, metal regions may be formed on the basis of a radiation sensitive material, which may act as a dielectric material, which may then be selectively removed in a self-aligned manner to form recesses that may subsequently be closed by a dielectric cap material. Consequently, also in this case, a very efficient overall manufacturing flow may be accomplished while nevertheless providing a high degree of flexibility in selectively providing air gaps in a complex metallization system.

One illustrative method disclosed herein comprises forming a plurality of recesses in a dielectric layer of a metallization layer of a semiconductor device by removing material of the dielectric layer between a plurality of metal regions formed in the dielectric layer. Moreover, the recesses are filled with a radiation sensitive material. Additionally, the method comprises selectively exposing the radiation sensitive material to a radiation beam to form an exposed portion and a non-exposed portion of the radiation sensitive material, wherein the exposed portion is formed in a first subset of the plurality of recesses and the non-exposed portion is formed in a second subset of the plurality of recesses. Moreover, the method comprises performing a specified material removal process to remove the exposed portion or the non-exposed portion and depositing a dielectric cap layer to close recesses of the first subset or the second subset in order to form an air gap in the recesses.

A further illustrative method disclosed herein comprises forming a radiation sensitive material above a dielectric material of a metallization system of a microstructure device. The method further comprises forming a plurality of metal regions at least in the radiation sensitive material. Additionally, the radiation sensitive material is selectively exposed to a radiation beam to form an exposed portion and a non-exposed portion of the radiation sensitive material. The method further comprises removing the exposed portion or the non-exposed portion to form recesses between two or more of the plurality of metal regions. Additionally, the method comprises forming a dielectric cap layer above the plurality of metal regions to form gaps on the basis of the recesses.

One illustrative microstructure device disclosed herein comprises a plurality of metal regions that are formed in a metallization layer. Moreover, an air gap is located between a first pair of neighboring metal regions of the plurality of metal regions. Additionally, the microstructure device comprises a radiation sensitive dielectric material formed between a second pair or neighboring metal regions of the plurality of metal regions, wherein the radiation sensitive dielectric material is in a cross-linked molecular state. Furthermore, the microstructure device comprises a dielectric cap material covering the air gap and the radiation sensitive material.

BRIEF DESCRIPTION OF THE DRAWINGS

The disclosure may be understood by reference to the following description taken in conjunction with the accompanying drawings, in which like reference numerals identify like elements, and in which.

Figure 1A:
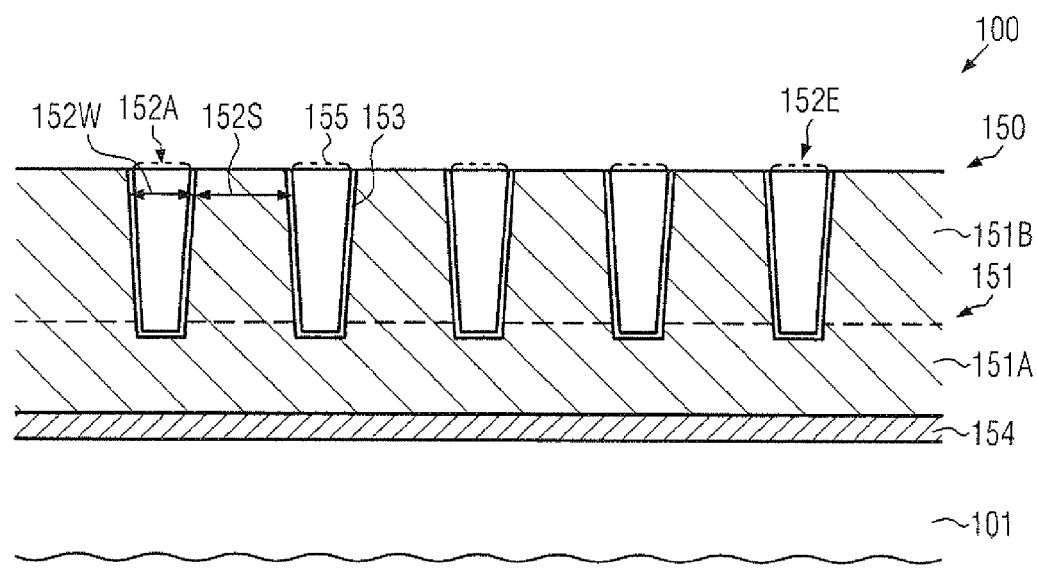
FIGS. 1a-1g schematically illustrate cross-sectional views of a microstructure device during various manufacturing stages in forming air gaps in a metallization system on the basis of a self-aligned technique and in a locally restricted manner by refilling recesses in a global way, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and microstructure devices, for instance integrated circuits, in which the electrical performance of a metallization system may be enhanced by providing air gaps in critical device regions on the basis of a self-aligned technique, while efficiently avoiding the formation of air gaps in other device areas. As previously discussed, the presence of air gaps may significantly enhance performance of the metallization system, in particular in device areas in which closely spaced metal regions may be present, while, in other device areas, the presence of air gaps may not be desirable, for instance in view of mechanical integrity and the like. In this case, according to some illustrative embodiments, recesses may be formed on the basis of conventional efficient process techniques by taking advantage of the etch selectivity of a plurality of dielectric materials with respect to the metal regions, wherein the recesses may be refilled in a subsequent manufacturing stage by a radiation sensitive material, such as organic materials having the characteristic of generating cross-links in its molecular structure upon absorbing radiation energy, such as ultraviolet light, x-ray energy, electron beams, ion beams and the like. For example, a plurality of materials are available, for instance in the form of organic materials, silicon-based materials and the like, in which the radiation energy provided during a lithography process may result in a significant modification of the molecular structure so that appropriate material characteristics may be provided, such as dielectric strength, mechanical stability and the like, to enable the further processing of these materials according to the overall device and process requirements. Consequently, after refilling the recesses, the radiation sensitive material may be selectively removed without requiring the deposition of further mask materials, such as photoresist and the like, thereby providing a highly efficient manufacturing process.

In other illustrative embodiments disclosed herein, the metal regions may be directly formed in a radiation sensitive material, which may be appropriately exposed to radiation, such as a lithography process, in order to form the recesses in a locally selective manner, as required. On the other hand, the non-removed portion of the radiation sensitive material may provide sufficient dielectric strength and mechanical stability so as to allow the further processing of the device, as is also discussed above. Thus, in this case, a plurality of process steps, such as the deposition of dielectric material, the recessing thereof and the subsequent refilling of the recesses, may be omitted, thereby even further enhancing the overall process efficiency.

Since the present disclosure relates to techniques and devices which enable the positioning and dimensioning of air gaps in a self-aligned and locally selective manner, the principles disclosed herein may be highly advantageously applied to sophisticated microstructure devices, such as integrated circuits, including transistor elements of the 45 nm technology or the 22 nm technology and beyond. The principles disclosed herein, however, may also be applied to less critical microstructure devices, thereby enabling the usage of less critical dielectric materials, since corresponding air gaps may be provided at device areas requiring a low relative permittivity, which may be achieved even with "conventional" dielectric materials. Thus, the present disclosure should not be considered as being restricted to specific critical device dimensions unless such restrictions are explicitly set forth in the appended claims or in embodiments described in the specification.

FIG. 1a schematically illustrates a cross-sectional view of a microstructure device 100 which, in the embodiment shown, may be represented by an integrated circuit including circuit elements, such as transistors, capacitors, resistors and the like. In this case, the device 100 may comprise a device level formed in and above a substrate 101, as will be described in more detail later on. In other cases, the substrate 101 may include any appropriate microstructure features, such as micromechanical components, opto electronic components and the like, wherein at least some of these components may require the provision of interconnect structures formed in a metallization system 150. As previously explained, in highly complex integrated circuits, a very large number of electrical connections may be required and thus a plurality of metallization layers may typically be formed in the metallization system 150, wherein, for convenience, a portion of a single metallization layer is illustrated so as to represent the metallization system 150. It should be appreciated, however, that below and/or above the metallization system 150, which may for convenience also be referred to as metallization layer 150, one or more additional metallization layers may be provided, depending on the overall complexity of the device 100. For any of these additional metallization layers, the same criteria may apply as will be described later on with reference to the metallization layer 150. The metallization layer 150 may comprise a dielectric material 151, which may be provided in the form of any appropriate material or material composition so as to obtain the desired electrical and mechanical characteristics. For example, the dielectric material 151 may comprise a material having a moderately low permittivity while also providing sufficient mechanical robustness in view of the further processing of the device 100, as previously explained. Since the final permittivity of the metallization layer 150 may be adjusted, at least locally, on the basis of air gaps to be formed in certain areas, the selection of an appropriate dielectric material may preferably be based on the compatibility of this material in view of the subsequent processing rather than with respect to a minimum dielectric constant. For instance, a plurality of well-established dielectric materials with a moderately low dielectric constant in the range of approximately 4.0-2.5 may be used in the metallization layer 150. For instance, doped silicon dioxide, silicon carbide, a plurality of silicon, oxygen, carbon and hydrogen-containing materials and the like may be used. In other cases, appropriate polymer materials may be used for the metallization layer 150 as long as the desired compatibility with the further processing may be achieved. Furthermore, in some illustrative embodiments, the dielectric material 151 may comprise a first dielectric layer 151A, which may have the desired dielectric characteristics, while a second dielectric layer 151B may be considered as a sacrificial material that may be removed in a later manufacturing stage on the basis of an appropriate removal process. On the other hand, the sacrificial layer 151B may provide the required mechanical and chemical characteristics for being processed to receive regions 152A . . . 152E. For instance, the sacrificial layer 151B may be comprised of an oxide-based material, an organic material, amorphous carbon, diamond-like carbon and the like, which may be efficiently etched on the basis of appropriate plasma assisted or wet chemical etch recipes, etching processes and the like. In other illustrative embodiments, the dielectric material 151 may represent any substantially homogenous material composition, while, in other cases, additionally, an etch stop layer, comprised of any appropriate material, may be formed within the dielectric material 151 in order to provide enhanced process control during the patterning of the material 151 and a sequence for forming recesses adjacent to the metal regions 152A . . . 152E in a later manufacturing stage. It should be appreciated that the metallization layer 150 may comprise a further dielectric material 154, which may represent an etch stop material, for instance in the form of a silicon carbide, a nitrogen-containing silicon carbide material, a silicon nitride material and the like.

The metal regions 152A . . . 152E may represent any type of metal features, such as metal line portions and the like, wherein one lateral dimension, for instance a width 152W, may be approximately 100 nm and less, if sophisticated metallization levels are considered. In other cases, the width 152W may vary within the metallization layer 150, for instance when narrow metal lines may be required in combination with wide metal lines within the same metallization level. It should be appreciated, however, that the width 152W may be selected in accordance with the overall design rules. Similarly, a spacing adjacent to two of the metal lines 152A . . . 152E, indicated as 152S, may be in the range of 100 nm and less if very critical device areas are considered, in which a plurality of closely spaced metal lines is to be provided. However, the spacing 152S may have any other appropriate value, depending on the overall design rules for the device 100. Furthermore, the metal regions 152A . . . 152E may comprise a conductive barrier material 153, possibly in combination with corresponding conductive cap layers 155, thereby providing confinement of a sensitive metal material, such as copper, while also providing a desired degree of etch selectivity with respect to an etch process in a subsequent manufacturing stage.

Typically, the semiconductor device 100 as illustrated in FIG. 1a may be formed on the basis of the following processes. After forming corresponding circuit elements in and above the substrate 101, one or more metallization layers may be formed, such as the metallization layer 150. To this end, the dielectric material 151 may be formed on or above the dielectric layer 154 by using one or more appropriate deposition techniques, such as chemical vapor deposition (CVD), spin-on techniques and the like. As previously discussed, the dielectric layer 151 may comprise two or more different material layers, such as the layers 151A, 151B, which may be deposited on the basis of appropriate techniques, if required. Thereafter, a patterning sequence may be performed which may include the deposition of appropriate etch masks, such as photoresist material, possibly in combination with hard mask materials, an anti-reflective coating (ARC) material and the like, which may subsequently be patterned so as to form trenches and via openings (not shown) in the dielectric material 151. For this purpose, any appropriate patterning strategy may be used. Next, the corresponding openings may be filled, for instance with the barrier material 153, followed by the deposition of a highly conductive metal, such as copper, and the removal of any excess material, as is also previously described. Thereafter, the cap layer 155 may be formed, for instance on the basis of self-aligned deposition techniques, such as electrochemical deposition, selective CVD and the like.

Figure 1B:
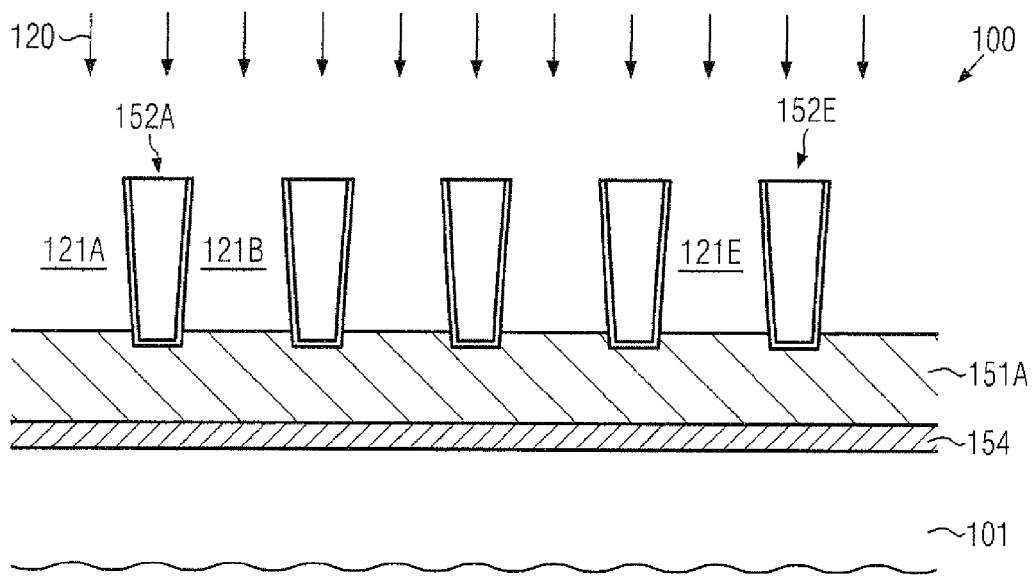

FIG. 1b schematically illustrates the microstructure device 100 when exposed to an ambient 120, which may be established on the basis of a plasma assisted etch chemistry, a wet chemical etch chemistry, a plasma ambient for ashing a portion of the dielectric material 151 and the like. Consequently, during the etch process 120, material of the layer 151 may be removed down to a specified depth, which may for instance be defined on the basis of a time controlled etch process for a given parameter setting or on the basis of the etch stop layer (not shown) or on the basis of the material 151A, if provided with a different material composition compared to the layer 151B (FIG. 1a). For example, the material 151B of FIG. 1a may be provided in the form of a "sacrificial" material and removal thereof may be accomplished with high efficiency and with a high degree of selectivity with respect to the metal regions 152A . . . 152E. In other cases, any fluorine-based or chlorine-based etch chemistries may be used of which a plurality of selective etch recipes are available in the art. Consequently, after completing the etch process 120, a plurality of recesses 121A . . . 121E are formed between an adjacent two of the metal regions 152A . . . 152E.

Figure 1C:
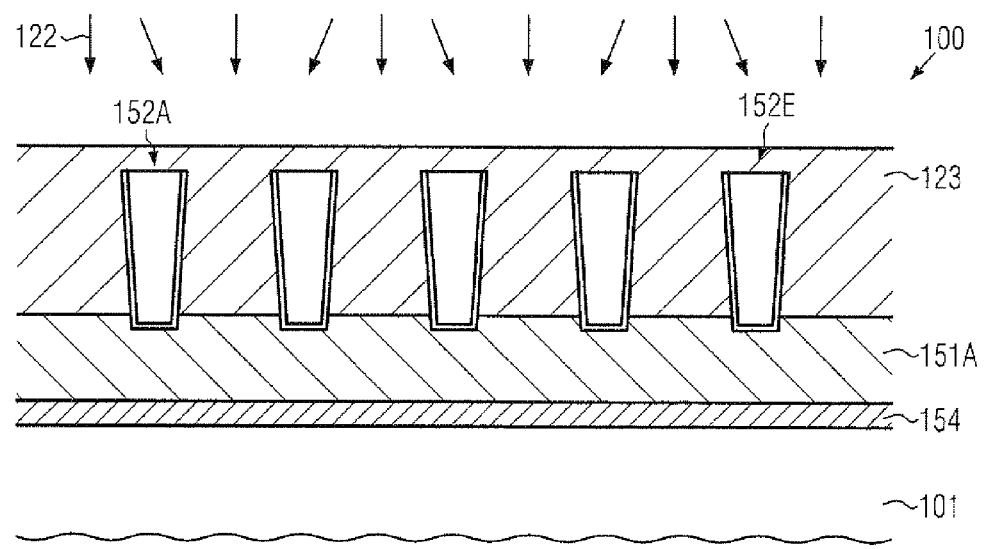

FIG. 1c schematically illustrates the microstructure device 100 during a deposition process 122 in order to provide a radiation sensitive material 123, which may be considered as a material that may alter its molecular structure, for instance, its "solvability" with respect to a specific etch ambient so as to be highly resistive with respect to the etch ambient upon exposure by appropriate radiation or so as to become volatile when exposed and contact with the specified etch ambient. In some illustrative embodiments, the material 123 may represent an organic material, a silicon-based material and the like, which may generate corresponding cross-links in its molecular structure upon being exposed to radiation, such as ultraviolet light and the like. For example, a plurality of materials are available which may exhibit a significant modification of its molecular state upon being exposed on the basis of exposure radiation, as is typically used in lithography processes performed in available lithography tools. For example, photo sensitive polyimide material, or any other polymer materials, may be used which may have efficient dielectric characteristics for acting as an interlayer dielectric material between some of the metal regions 152A . . . 152E, for which the presence of an air gap may not be desired. In some illustrative embodiments, the material 123 may be applied during the process 122 on the basis of spin-on techniques so that the material 123 may reliably fill the spacing between adjacent metal regions 152A . . . 152E due to the low viscous state. In other illustrative embodiments, the deposition process 122 may comprise any other deposition techniques, such as CVD-like deposition and the like. In some illustrative embodiments, after applying the material 123 and performing additional process steps, such as curing the material 123 and the like if provided in a low viscous state, the further processing may be continued by selectively exposing the material 123, as will be described with reference to FIG. 1e. In other illustrative embodiments, the material 123 may be further treated, for instance by planarizing the surface topography.

Figure 1D:
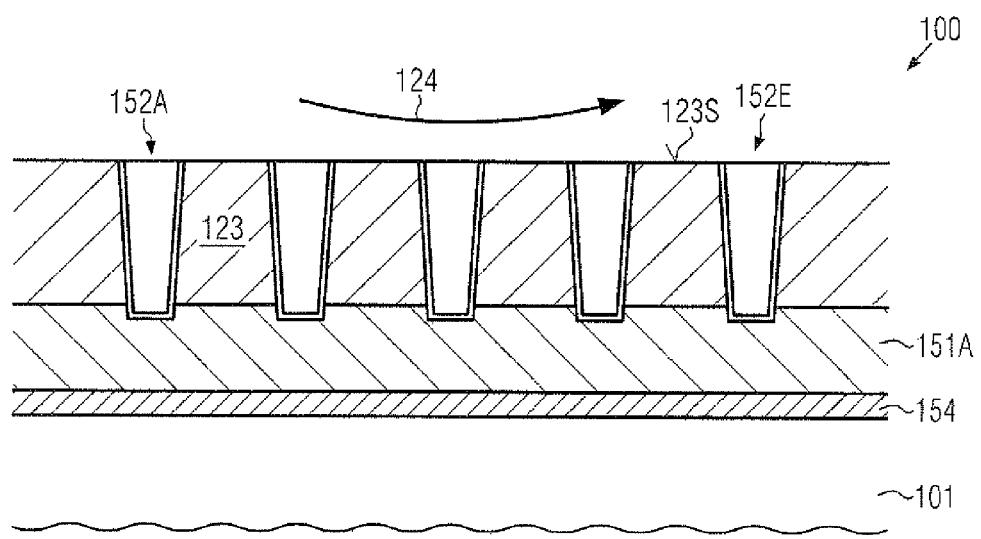

FIG. 1d schematically illustrates the device 100 when subjected to a planarization process 124 in order to remove undue surface irregularities which may be accomplished by wet chemical etch techniques, plasma assisted etch techniques, CMP and the like. During the planarization process 124, the metal regions 152A . . . 152E may be used as efficient stop elements in order to control the process 124, while, in other cases, a substantially planar surface 123S may be obtained without actually exposing the metal regions 152A . . . 152E.

Figure 1E:
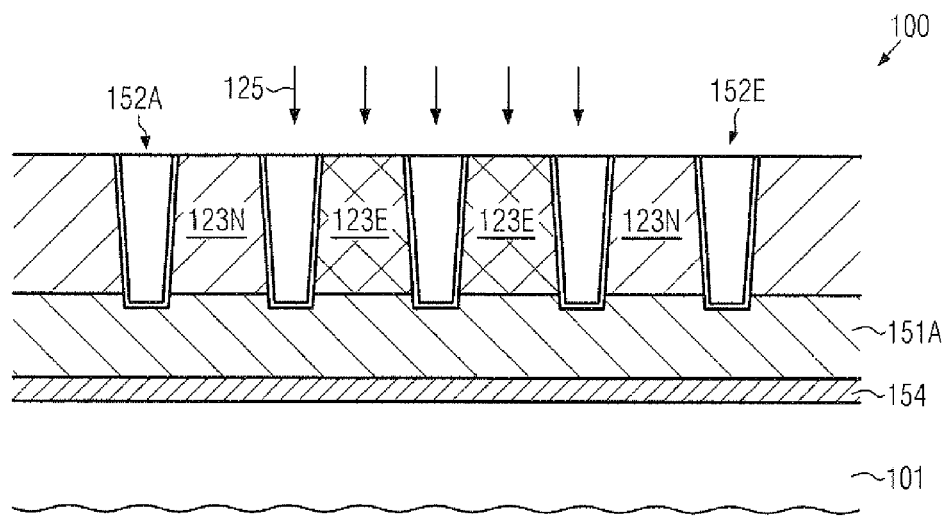

FIG. 1e schematically illustrates the device 100 during a selective exposure 125 of the material 123. In one illustrative embodiment, the exposure 125 may be performed as a photolithography process by using well-established lithography tools in combination with an appropriate lithography mask so as to expose a portion 123E of the material 123 while substantially preventing a portion 123N from being exposed. As previously explained, the material 123 may thus undergo a significant modification, for instance the exposed portion 123E may generate cross-links in its molecular structure, thereby receiving an increased etch resistivity with respect to a specific etch or development process. In other cases, the material 123, as initially provided and treated, may have an increased etch resistivity while the exposed portion 123E may become more volatile with respect to a specific etch ambient. In other illustrative embodiments, the exposure process 125 may be performed on the basis of a scanning radiation beam, which may be established by a laser spot, which may be appropriately scanned across the substrate 101 in order to selectively expose the portion 123E while avoiding exposure to the beam for the portion 123N. For this purpose, sophisticated laser-based anneal systems may be used in which appropriate scan patterns may be applied for moving a laser beam relative to the substrate 101, thereby depositing a desired amount of energy within a restricted area of the substrate 101. Thus, based on the resolution of the corresponding scanning radiation beam, the portion 123E may be formed in a locally selective manner. In other cases, other radiation beams, such as electron beams, ion beams, x-ray beams and the like, may be used, as long as significant deterioration of the metal regions 152A . . . 152E may be avoided.

Figure 1F:
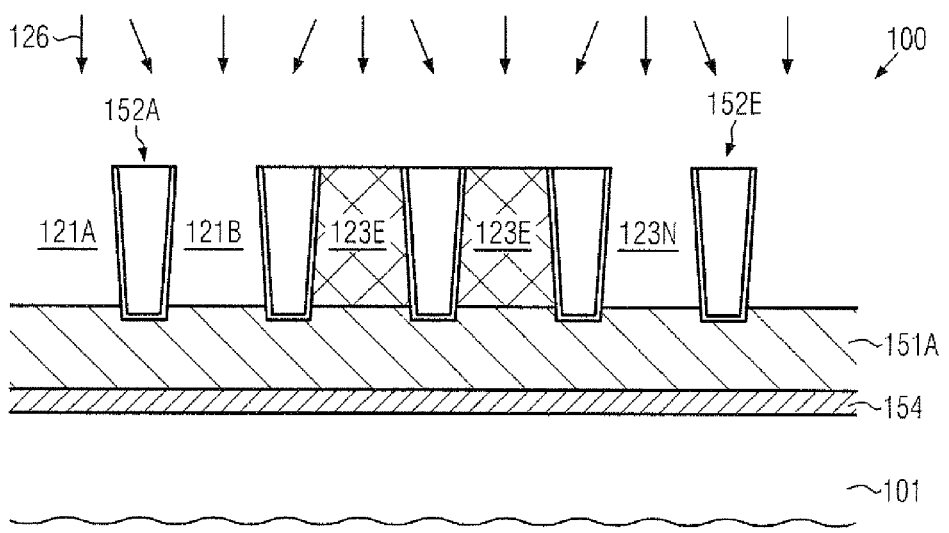

FIG. 1f schematically illustrates the device 100 during a removal process 126 in which a non-exposed portion or an exposed portion of the material 123 may be selectively removed. In the embodiment shown, the exposed portion 123E, for instance having a cross-linked molecular structure, may exhibit an enhanced etch resistivity during the process 126 and thus the non-exposed portion 123N (FIG. 1e) may be efficiently removed, thereby re-establishing the recesses 121A, 121B. It should be appreciated that a plurality of removal recipes are available for radiation sensitive materials, such as a plurality of resist developers, tetra methyl ammonium hydroxide (TMAH) and the like.

Figure 1G:
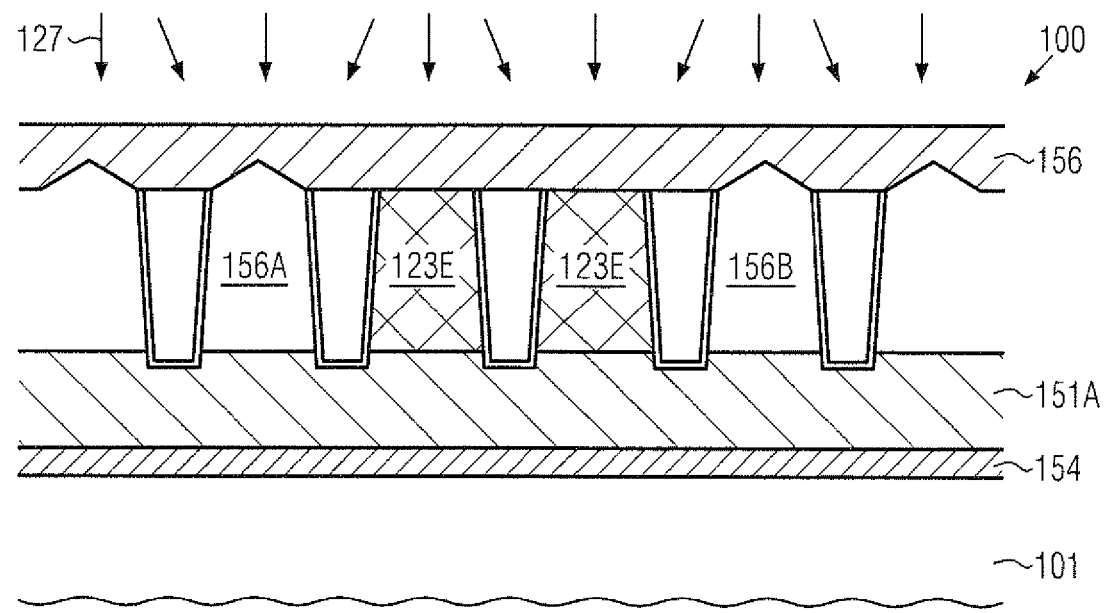

FIG. 1g schematically illustrates the device 100 during a deposition process 127 in which a dielectric material 156, which may be considered as a dielectric cap material, may be deposited so as to close the corresponding recesses in order to form gaps or air gaps 156A, 156B. The dielectric material 156 may be provided in the form of any appropriate dielectric material, such as low-k dielectric materials, conventional dielectrics, such as silicon dioxide and the like. During the deposition process 127, deposition parameters may be appropriately adjusted in order to create pronounced overhangs at the top of the metal regions 152A, 152B, thereby achieving a rapid closure and thus confinement of the corresponding recesses without significantly reducing the interior volume thereof. Hence, the air gaps 156A, 156B may be reliably closed so as to be not unduly affected during the further processing, i.e., the deposition of a further dielectric material and patterning the same so as to receive metal regions in accordance with the overall device requirements. On the other hand, the dielectric material 156 may be formed above the exposed portion 123E, thereby also imparting enhanced stability to this portion in view of the further processing of the device 100.

With reference to FIGS. 1h-1k, the device 100 is described in accordance with further illustrative embodiments, in which the metal regions may be formed in the radiation sensitive material in order to further enhance the overall process efficiency.

Figure 1H:
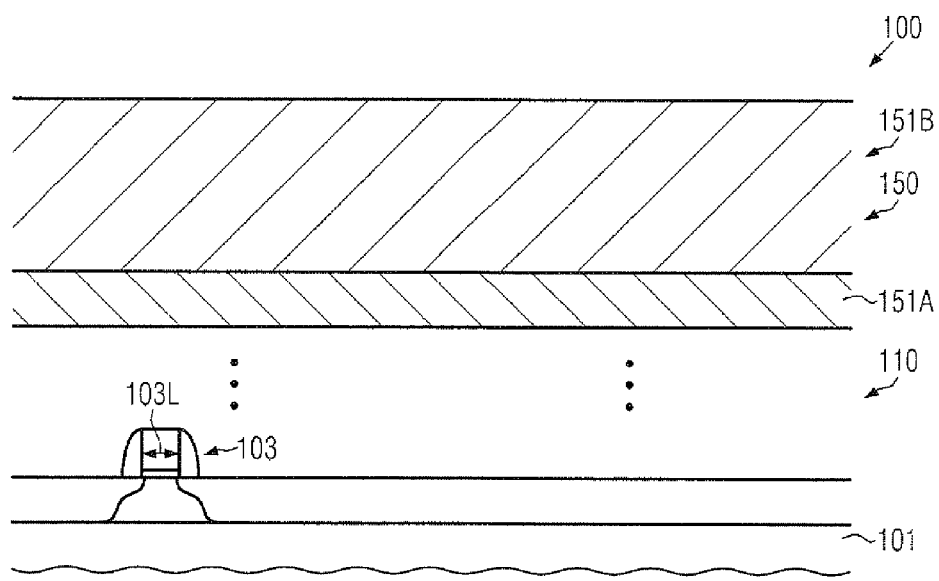
FIGS. 1h-1k schematically illustrate cross-sectional views of the microstructure device in the form of an integrated circuit during various manufacturing stages in which air gaps may be formed in a locally restricted manner on the basis of a radiation sensitive material, which may also be used as a material for forming metal regions therein, according to further illustrative embodiments.

FIG. 1h schematically illustrates the device 100 in which a device level 110 may comprise circuit elements 103 having a critical dimension, indicated as 103L, which may be approximately 40 nm and less, for instance the dimension 103L may represent a length of a gate electrode of sophisticated field effect transistors. Furthermore, the device 100 may comprise a metallization system that may be appropriately connected to the device level 110 by any appropriate contact structure (not shown) and additional metallization layers (not shown). For convenience, the metallization system may be represented by the metallization layer 150, as is also previously explained. In the manufacturing stage shown, the metallization layer 150 may comprise the first dielectric material 151A, for instance in the form of any appropriate dielectric material, as is also previously explained. Furthermore, the second dielectric material 151B may be provided in the form of a radiation sensitive material, as is explained above with reference to the material 123 illustrated in FIG. 1c. Thus, the material 151B may provide sufficient dielectric characteristics, such as dielectric strength, mechanical stability, as may be required for the further processing of the device 100, while at the same time allowing an efficient removal of an exposed portion or a non-exposed portion, depending on the type of material used.

Figure 1I:
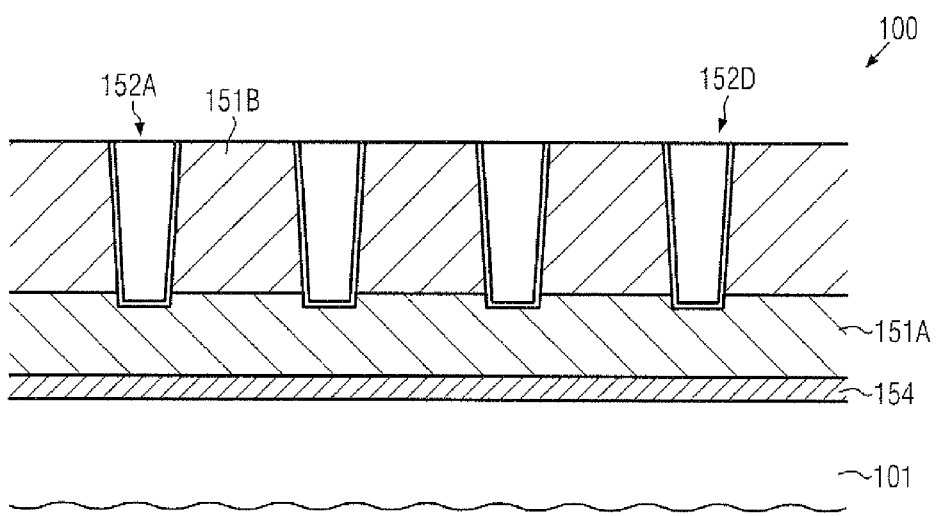

FIG. 1*i* schematically illustrates the device 100 in a further advanced manufacturing stage. For convenience, only the metallization layer 150 may be illustrated in FIG. 1*i*. As shown, the metal regions 152A ... 152D may be formed in the material 151B and may extend into the material 151A according to the overall device requirements. With respect to any characteristics of the metal regions 152A ... 152D, the same criteria may apply as previously explained. The metal regions 152A ... 152D may be formed on the basis of well-established process techniques during which appropriate etch masks may be provided so as to maintain integrity of the material 151B, which may have a less stable configuration prior to being exposed to the appropriate radiation. Thus, by appropriately providing etch masks, for instance in the form of resist masks, hard masks, ARC materials and the like, undue modification of the molecular structure of the material 151B may be substantially avoided. It should further be appreciated that, typically, the material 151B may provide sufficient mechanical stability so as to enable the removal of any excess material, such as copper, barrier material and the like, during the formation of the metal regions 152A ... 152D.

Figure 1J:
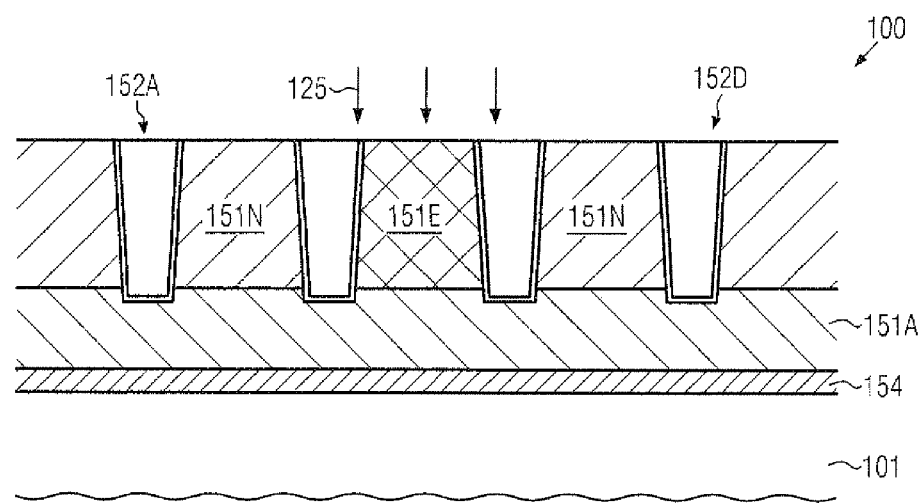

FIG. 1*j* schematically illustrates the device 100 during the exposure process 125, thereby forming an exposed portion 151E, which may have a cross-linked molecular structure, as previously explained, and forming a non-exposed portion 151N, which may exhibit a reduced etch resistivity with respect to a specified etch ambient.

Figure 1K:
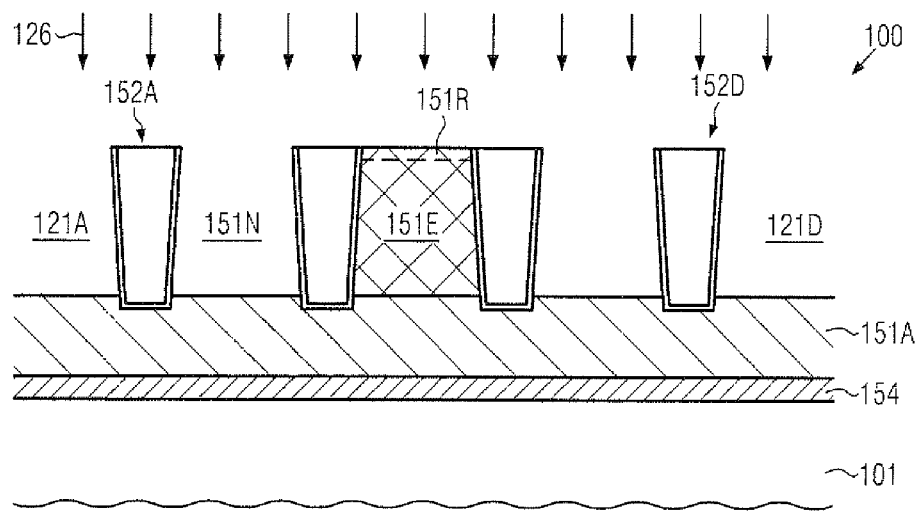

FIG. 1*k* schematically illustrates the device 100 during the etch process 126 in which the recesses 121A ... 121D may be formed by removing the portion 151N (FIG. 1*j*) selectively to the portion 151E and to the metal regions 152A ... 152D. It should be appreciated that a certain degree of recessing of the portion 151E, as indicated by 151R, may not unduly affect the overall characteristics of the device 100, since, in a subsequent deposition process for closing the recesses 121A ... 121D, the recess 151R may be reliably filled. Consequently, also in this embodiment, air gaps may be selectively formed on the basis of a highly efficient process flow in which the radiation sensitive material itself may be used as a dielectric material for forming therein the metal regions without requiring additional deposition and etch processes.

As a result, the present disclosure provides techniques and semiconductor devices in which self-aligned air gaps may be provided in a locally selected manner by refilling previously formed recesses with a radiation sensitive material or by forming the metal regions in the radiation sensitive material and by selectively exposing the radiation sensitive material to an appropriate exposure radiation. Consequently, the exposed portion or the non-exposed portion may be efficiently removed without requiring additional masking steps and the like. Hence, a highly cost-efficient manufacturing sequence and corresponding microstructure devices may be provided with superior performance of a metallization system.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method comprising:
   forming plurality of recesses in a dielectric layer of a metallization layer of a semiconductor device by removing material of said dielectric layer between a plurality of metal regions formed in said dielectric layer;
   filling said recesses with a radiation sensitive material;
   selectively exposing said radiation sensitive material to radiation so as to form an exposed portion and a non-exposed portion of said radiation sensitive material, said exposed portion being formed in a first subset of said plurality of recesses and said non-exposed portion being formed in a second subset of said plurality of recesses;
   performing a specified material removal process so as to remove one of said exposed portion and said non-exposed portion; and
   depositing a dielectric cap layer so as to close said recesses of one of said first and second subsets to form an air gap.

2. The method of claim 1, wherein said performing said specified removal process comprises removing said non-exposed portion of the radiation sensitive material.

3. The method of claim 1, wherein forming said recess comprises performing an etch process to remove material of said dielectric layer selectively to said plurality of metal regions.

4. The method of claim 1, further comprising forming said dielectric layer by depositing a first material layer and a second material layer and wherein said recesses are formed so as to extend at least through said second material layer.

5. The method of claim 1, wherein forming said recesses comprises removing said material on the basis of a time controlled etch process.

6. The method of claim 1, further comprising planarizing said radiation sensitive material prior to forming said exposed and non-exposed portions.

7. The method of claim 1, wherein selectively exposing said radiation sensitive material comprises performing a photolithography process.

8. The method of claim 1, wherein selectively exposing said radiation sensitive material comprises using a scanning radiation beam.

9. The method of claim 1, wherein a spacing between two neighbouring metal regions of said plurality of metal regions is approximately 100 nanometer (nm) or less.

10. The method of claim 4, wherein forming said recesses comprises removing said second material layer by using said plurality of metal regions and said first material layer as etch stop materials.

11. A method comprising:
    forming a radiation sensitive material above a dielectric material of a metallization system of a microstructure device;
    forming a plurality of metal regions at least in said radiation sensitive material;
    selectively exposing said radiation sensitive material to radiation so as to form an exposed portion and a non-exposed portion of said radiation sensitive material;
    removing one of said exposed portion and said non-exposed portion so as to form recesses between two or more of said plurality of metal regions; and
    forming a dielectric cap layer above said plurality of metal regions so as to form gaps on the basis of said recesses.

12. The method of claim 11, wherein said non-exposed portion is removed.

13. The method of claim 11, wherein selectively exposing said radiation sensitive material comprises performing a photolithography process.

14. The method of claim 11, wherein selectively exposing said radiation sensitive material comprises scanning said radiation beam without using a lithography mask.

15. The method of claim 11, wherein selectively exposing said radiation sensitive material comprises generating cross-links in said exposed portion.

16. The method of claim 11, wherein a spacing between two neighbouring metal regions of said plurality of metal regions is approximately 100 nanometer or less.

17. A microstructure device comprising:
 a plurality of metal regions formed in a metallization layer;
 an air gap located between a first pair of neighbouring metal regions of said plurality of metal regions, said air gap formed by selectively exposing a radiation sensitive dielectric material to radiation so as to form an exposed portion and a non-exposed portion of said radiation sensitive dielectric material and removing said exposed portion;
 a cross-linked radiation sensitive dielectric material formed between a second pair of neighbouring metal regions of said plurality of metal regions and comprising said non-exposed portion, said cross-linked radiation sensitive dielectric material being in a cross-linked molecular state; and
 a dielectric cap material covering said air gap and said cross-linked radiation sensitive material.

18. The device of claim 17, wherein a width of said air gap is approximately 100 nanometer or less.

19. The device of claim 17, further comprising transistor elements having a gate length of approximately 30 nanometers or less.

20. The device of claim 18, wherein said radiation sensitive dielectric material is comprised of an organic material.

21. The device of claim 18, wherein said radiation sensitive dielectric material is comprised of a silicon based material.

* * * * *